(12) United States Patent  
Li et al.

(10) Patent No.: US 12,237,620 B2  
(45) Date of Patent: Feb. 25, 2025

(54) DEVICE-TO-DEVICE CONNECTION WITH MULTIPLE PARALLEL GROUND PINS

(71) Applicant: Intel Corporation, Santa Clara, CA (US)

(72) Inventors: Xiang Li, Portland, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 17/214,397

(22) Filed: Mar. 26, 2021

(65) Prior Publication Data

US 2021/0313744 A1    Oct. 7, 2021

(51) Int. Cl.
*H01R 13/6471* (2011.01)
*H01R 12/73* (2011.01)
*H01R 12/57* (2011.01)
*H01R 13/03* (2006.01)

(52) U.S. Cl.
CPC ....... *H01R 13/6471* (2013.01); *H01R 12/737* (2013.01); *H01R 12/57* (2013.01); *H01R 13/03* (2013.01); *H01R 2201/06* (2013.01)

(58) Field of Classification Search
CPC .. H01R 13/6471; H01R 12/737; H01R 12/57; H01R 13/03; H01R 2201/06
See application file for complete search history.

(56) References Cited

U.S. PATENT DOCUMENTS

| | | | | |
|---|---|---|---|---|
| 9,257,778 B2* | 2/2016 | Buck | .................. | H01R 12/7005 |
| 9,520,689 B2* | 12/2016 | Cartier, Jr. | ........... | H01R 12/585 |
| 2013/0288534 A1* | 10/2013 | Degner | ................ | H01R 12/737 |
| | | | | 29/874 |
| 2014/0273671 A1* | 9/2014 | Cohen | .................. | H01R 13/113 |
| | | | | 439/891 |
| 2015/0171535 A1* | 6/2015 | Li | ........................ | H01R 12/721 |
| | | | | 439/78 |

(Continued)

FOREIGN PATENT DOCUMENTS

CN         110768065 A      2/2020

OTHER PUBLICATIONS

Smith, Ryan, "DDR5 Memory Specification Released: Setting the Stage for DDR5-6400 and Beyond", AnandTech, https://www.anandtech.com/show/15912/ddr5-specification-released-setting-the-stage-for-ddr56400-and-beyond, Jul. 14, 2020, 6 pages.

(Continued)

*Primary Examiner* — Hae Moon Hyeon  
(74) *Attorney, Agent, or Firm* — Compass IP Law PC

(57) ABSTRACT

Examples described herein relate to a pin arrangement that includes a first signal pin; a second signal pin; and multiple parallel ground pins positioned between the first and second signal pins. In some examples, the multiple parallel ground pins are coupled to a single pin connector coupled to a first device and a single pin connector coupled to a second device. In some examples, a first leg of the multiple parallel ground pins is positioned parallel to a portion of the first signal pin and wherein a second leg of the multiple parallel ground pins is positioned parallel to a portion of the second signal pin. In some examples, the multiple parallel ground pins provide a 1:N signal to ground ratio for signals transmitted through at least a portion of the first and second signal pins, where N is greater than 1.

15 Claims, 10 Drawing Sheets

(56) References Cited

U.S. PATENT DOCUMENTS

| | | | |
|---|---|---|---|
| 2017/0047686 A1* | 2/2017 | Wig | H01R 13/6471 |
| 2018/0276176 A1* | 9/2018 | Wig | G06F 13/4282 |
| 2019/0245309 A1 | 8/2019 | Lee et al. | |
| 2022/0029358 A1* | 1/2022 | Lin | H01R 12/727 |
| 2024/0079827 A1* | 3/2024 | Cao | H01R 13/516 |

OTHER PUBLICATIONS

Dutch Examination Report for Patent Application No. 2030962, Mailed Feb. 10, 2023, 9 pages.

Huang, Shaowu, et al., "Suppression of Couplings in High-Speed Interconnects Using Absorbing Materials", IEEE Transactions on Electromagnetic Compatibility, vol. 58, No. 5, Oct. 2016, 8 pages.

\* cited by examiner

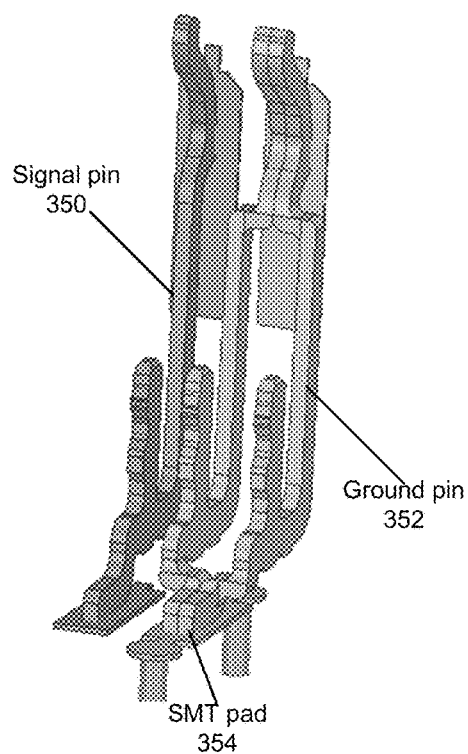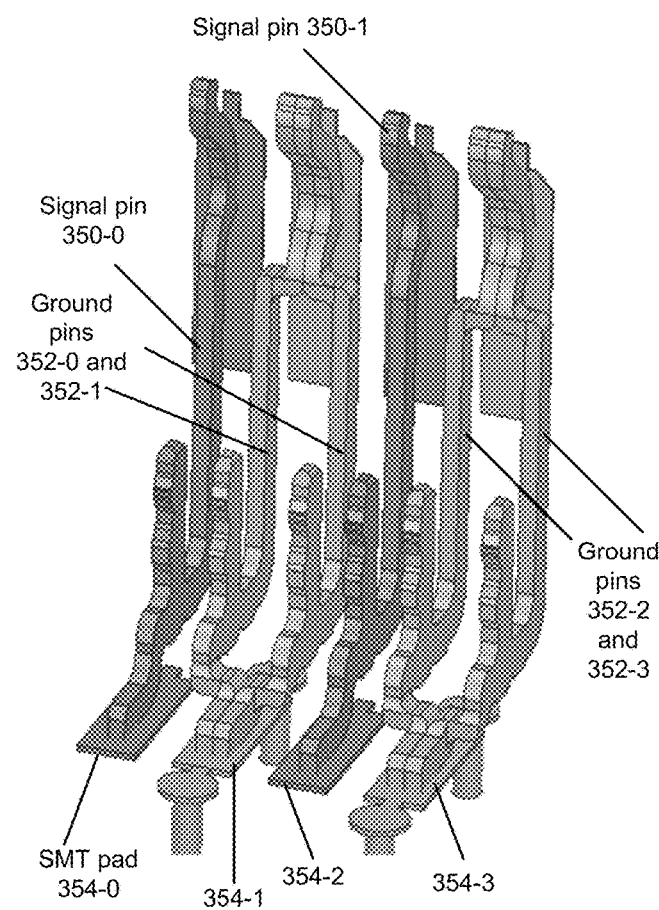
FIG. 3C                    FIG. 3D

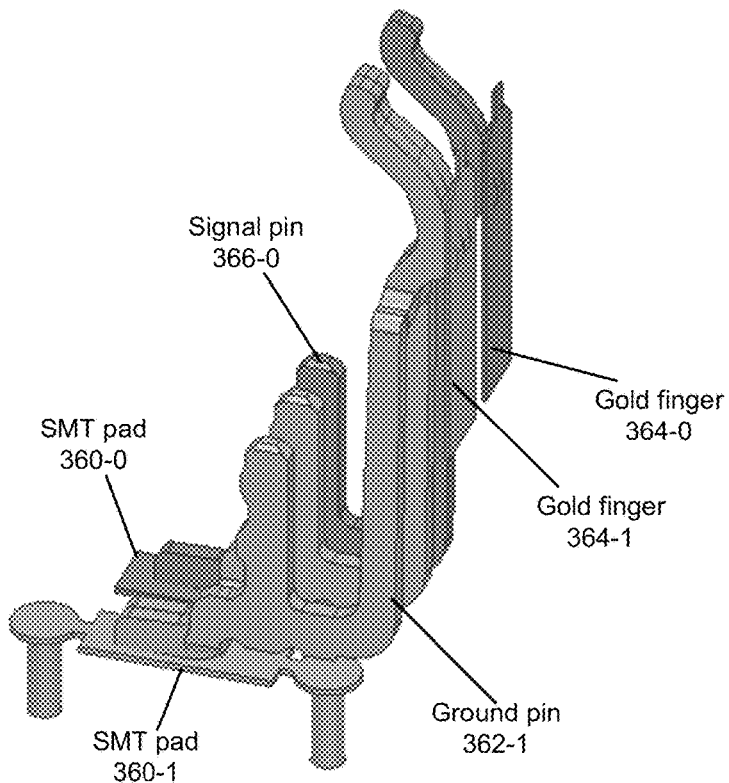
FIG. 3E
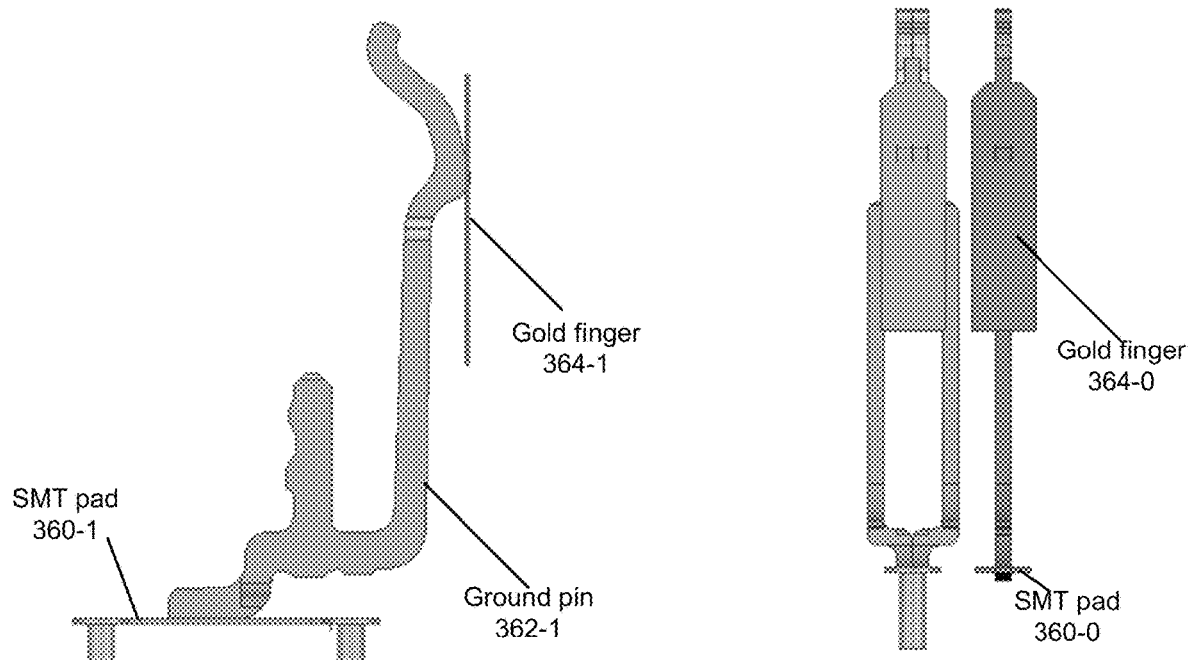
FIG. 3F
FIG. 3G

DEVICE-TO-DEVICE CONNECTION WITH MULTIPLE PARALLEL GROUND PINS

Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications.

DDR5 unregistered (U), registered (R), load reduce (LR) dual in-line memory module (DIMM) connectors are defined as a surface mount technology (SMT) connector with 1:1 signal to ground ratio. FIG. 1 shows an example of a DDR5 pinout with an arrangement of signal pins and ground pins with a 1:1 signal-to-ground pin (S/G) ratio. The SMT connector signal pins are shielded by the ground pins as one ground pin placed between two data input and output (DQ) signal pins to reduce the crosstalk between signal pins.

FIG. 2 shows another view of a connector pin design. Signal pins connect DIMM gold fingers (GF) to corresponding motherboard (MB) SMT pads. Ground pins are positioned between signal pins and connect other DIMM gold fingers to corresponding motherboard (MB) SMT pads.

BRIEF DESCRIPTION OF THE DRAWINGS

FIGS. 3A-3G show examples of a ground pin and signal pin arrangement and design.

DETAILED DESCRIPTION

Figure 1:
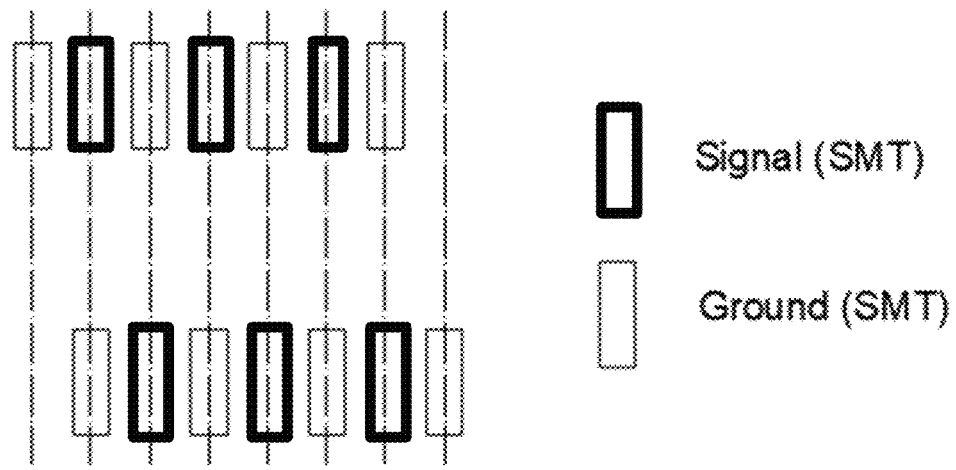
FIG. 1 shows an example of an arrangement of signal pins and ground pins.
Figure 2:
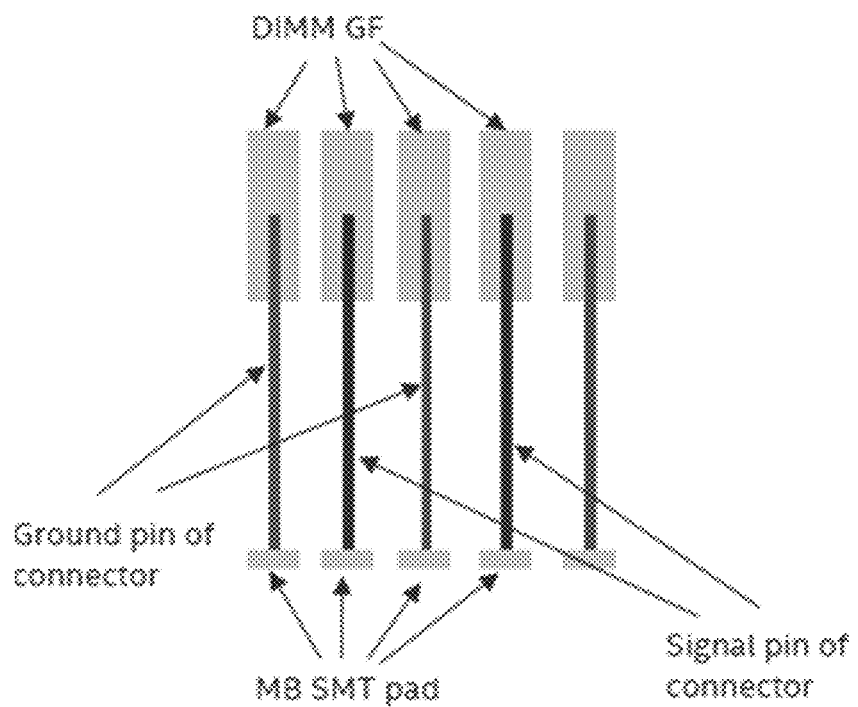
FIG. 2 shows another view of a connector pin design.

Signals transmitted using different signal pins can experience cross talk whereby signals transmitted on one signal pin can cause interference to signals transmitted on one or more other signal pins. In some cases, crosstalk can be caused by capacitive, inductive, or conductive coupling. In some cases, as in the examples of FIGS. 1 and 2, a ground pin may not provide sufficient protection against cross talk between signals transmitted using two or more adjacent signal pins and signal interference may reach undesired levels.

A single ground pin may not provide sufficient protection against cross talk between surrounding signal pins. A solution could include adding more ground pins to separate signal pins and changing ground pin and/or signal pin connector locations in a motherboard (MB) and locations of DIMM golden finger (GF) pads. However, DDR5 defines a module pinout with physical distances between signal pin connections and ground pin connections to gold fingers (GF) as well as to SMT pads. Accordingly, for DDR5 consistent systems, addition of more ground pins to reduce cross talk may not be feasible as there is a set physical arrangement of ground pin connections.

Various embodiments provide a ground pin with split parallel ground pin legs with a first end of the ground pin being able to connect with a ground pin connector and a second end of the ground pin being able to connect with GF connector positions in a DDR5 consistent DIMM and motherboard layout. A first ground pin leg can be oriented to extend parallel to a first signal pin whereas a second ground pin leg can be oriented to extend parallel to a second, different, signal pin. In some examples, a ground pin can include more than two legs. Various embodiments provide potentially improved signal-to-ground ratio and compatibility with DDR5 GF arrangements, compatibility with DDR5 motherboard design of SMT pad layouts, and compatibility with DDR5 DIMM designs.

FIGS. 3A-3G show examples of a ground pin and signal pin arrangement and design. FIGS. 3A-3G show examples of two ground pins at the same ground pin position, connected to a DIMM gold finger and a MB SMT pad. In some examples, ground pin connector 302-1 can include legs 302-1-A and 302-1-B. A first ground pin leg 302-1-A can be positioned parallel to a portion of a first signal pin 306-1. A second ground pin leg 302-1-B can be positioned parallel to a portion of a second signal pin 306-2. Ground pin connector 302-1 can be coupled, at one end, to MB SMT pad 304-2 and, at another end, to DIMM GF 308-2. Signal pin 306-1 can be coupled, at one end, to MB SMT pad 304-1 and, at another end, to DIMM GF 308-1. Signal pin 306-2 can be coupled, at one end, to MB SMT pad 304-3 and, at another end, to DIMM GF 308-3. Legs 302-1-A and 302-1B can join to form contact region 305-1 that conductively connect to SMT pad 304-2 at one end and legs 302-1-A and 302-1B can join to form contact region 307-1 that conductively connect to DIMM GF 308-2 at a second end.

Use of two ground pin legs, instead of a single leg, can change signal to ground ratio from 1:1 to 1:2 (or other signal to ground ratios of 1:N, where N is greater than 1) and reduce the crosstalk between signal pins, but still maintain 1:1 S/G at interfaces with MB SMT pads and DIMM GF and allow use of DDR5 consistent MB and DIMM arrangements. In other examples, more than two ground pin connector legs can be used, such as three, four or more. Accordingly, a ground pin with two or more legs can connect to a single SMT and a single DIMM GF. A first end of the ground pin can connect to a spring loaded GF connected to a DIMM. A second end of the ground pin can connect to an SMT, which is connected to a motherboard and connected to other board traces.

Various embodiments of a ground pin described herein can be used in connections to DIMMs and motherboards consistent at least with DDR3, DDR4, DDR5 as well as DDR4E, LPDDR4, LPDDR5, or others or combinations of memory technologies, and technologies based on derivatives or extensions of such specifications. Various embodiments of a ground pin described herein can be used as a ground pin between any coupling of devices that include a ground pin and two signal pins to change a signal to ground ratio from 1:N, where N is greater than 1. For example, a first device can include an accelerator or processor and a second device can include a memory device, another processor, or a motherboard.

Various embodiments of the ground pin can be manufactured by stamping and forming a metal such as, but not limited to, one or more of: copper, bronze, alloy (e.g., a combination of two or more metals), or any electrical or optical signal conductor. The thickness of the ground pins and distance between sides of ground pins can be set so that ground pins do not contact signal pins. Blanked pin manufacturing can control the ground pin thickness to ensure the interface to SMT and GF are within the required locations. In some examples, a thickness of a cross section of a ground pin leg can be approximately 0.1 mm, although other thicknesses can be used. In some examples, two ground pin connectors that are parallel to the signal pin for a length of approximately 2.6 mm. A cross section of a ground pin leg can be circular, oval, square, rectangular, or any combination thereof from the DIMM GF connection to MB SMT pad connection.

Figure 3A:
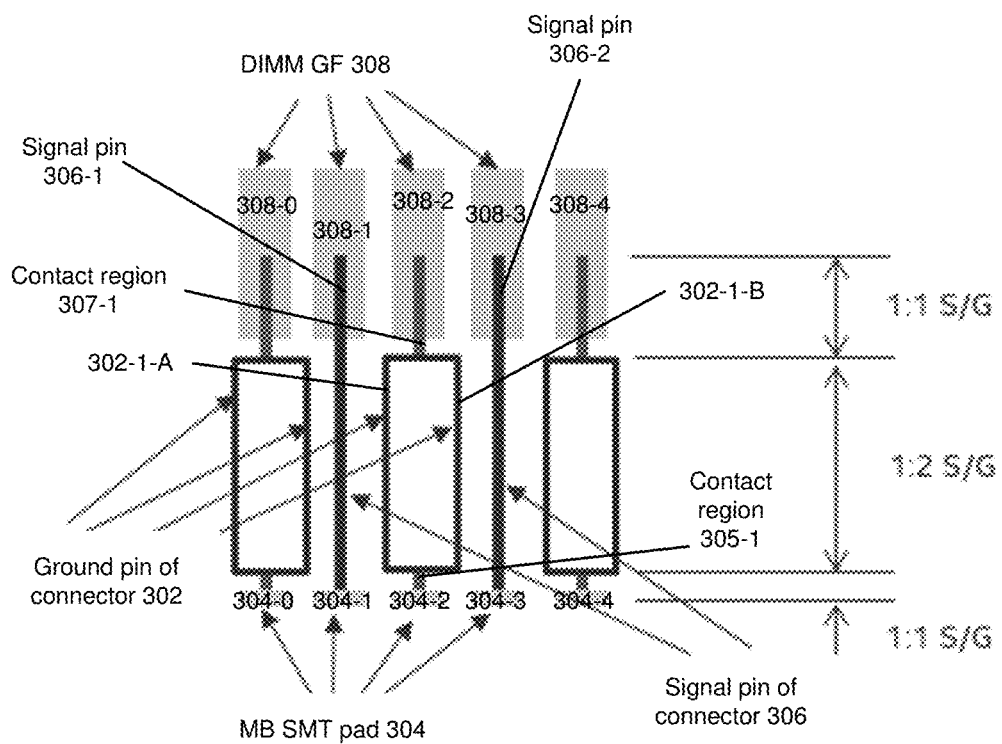

As shown in FIG. 3A, where the ground pin is expanded to two ground pin strands or legs arranged between signal pins and the ground pins can provide a 1:2 signal to ground ratio for a region along a length of the signal pins. Where the ground pin is a single stranded or a single leg, the ground pin can provide a 1:1 signal to ground ratio.

Figure 3B:
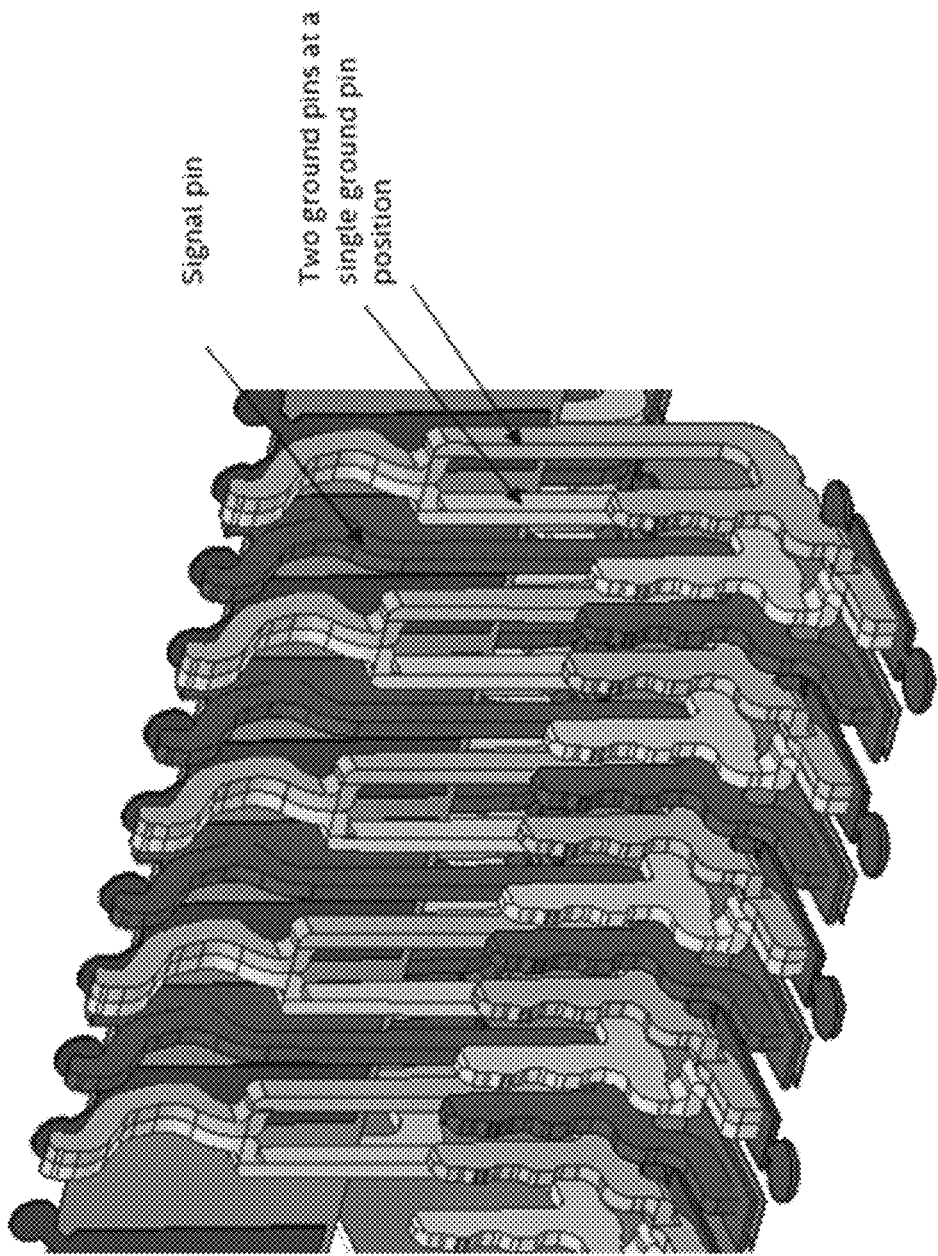

FIGS. 3B-3G depict different perspectives of ground pin and signal pin arrangements with connections to gold fingers and SMT pads. For example, FIG. 3B depicts an example of a signal pin and ground pin arrangement. For example, FIG. 3C depicts an example of signal pin 350 positioned next to ground pin 352 with multiple legs. FIG. 3D depicts an example of multiple signal pins 350-0 and 350-1 arranged on opposite sides of ground pins 352-0 and 352-1. In addition, signal pin 350-1 is positioned between ground pins 352-1 and 352-2. FIGS. 3E to 3G depict other example perspectives of signal pin 366-0 and ground pins 362-1 oriented with respect to SMT pads 360-0 and 360-1 and gold finger connections 364-0 and 364-1. The shapes and manner of connections of signal pins and ground pins are merely exemplary and any shapes and connections can be used.

Figure 4:
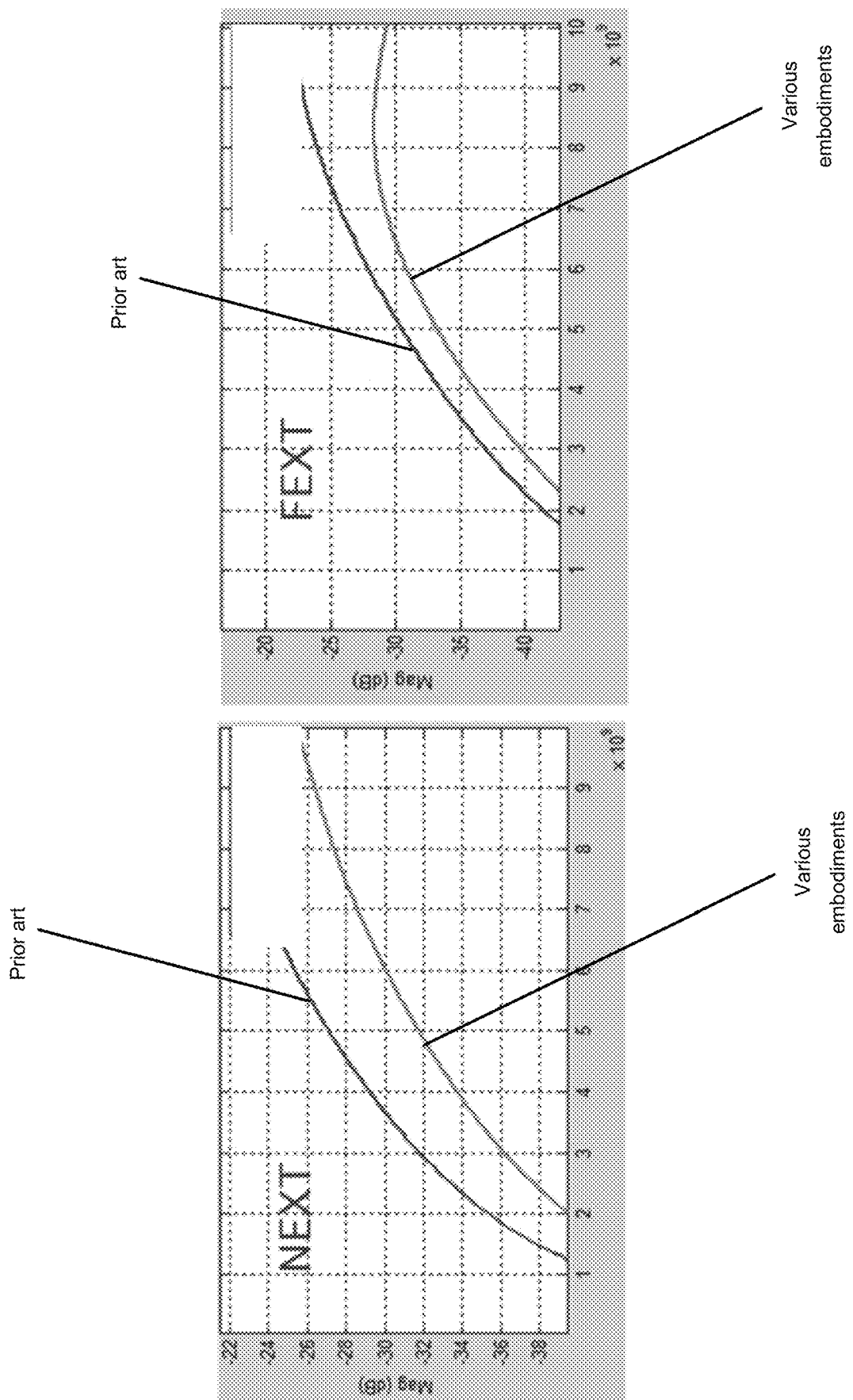
FIG. 4 shows an example of near end cross talk (NEXT) and far end cross talk (FEXT) reduction using various embodiments.

FIG. 4 shows an example of near end cross talk (NEXT) and far end cross talk (FEXT) reduction using various embodiments as compared to the prior art. Using various embodiments that provide multiple parallel ground pins parallel to signal pins, NEXT and FEXT can be reduced approximately 3 to 5 dB.

Figure 5A:
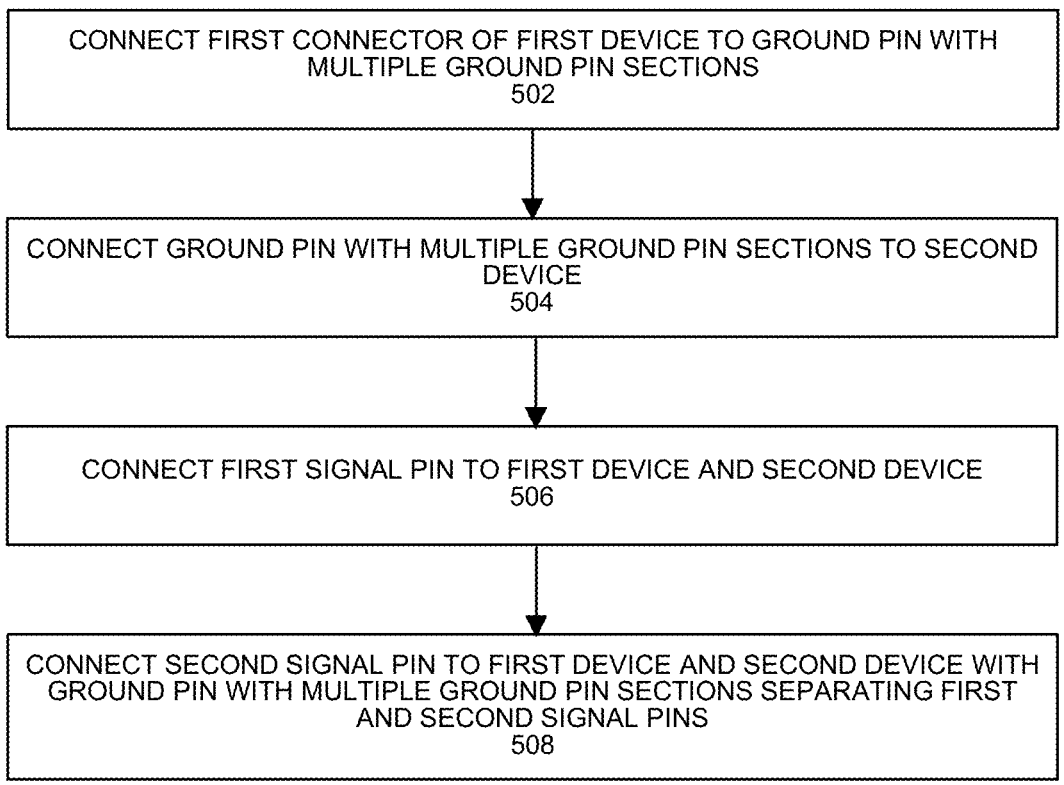
FIGS. 5A and 5B depict example processes.

FIG. 5A depicts an example process that can be used to form a connections between first and second devices. At 502, a first connector of a first device can be coupled to a ground pin with multiple parallel ground pin portions. In some examples, the ground pin can include two or more parallel ground pins. In some examples, the first device can include a motherboard and the first connector can be an SMT of a motherboard.

At 504, the ground pin with multiple parallel ground pin portions can be coupled to a first connector of a second device. In some examples, the second device includes a memory device and the first connector of the second device can include a gold finger of a DIMM.

At 506, a first signal pin can be coupled to a second connector of the first device and a second connector of the second device. In some examples, the second connector of a motherboard can include an SMT. In some examples, the second connector of a memory device can include a gold finger of a DIMM.

At 508, a second signal pin can be coupled to a third connector of the first device and a third connector of the second device. In some examples, the third connector of a motherboard can include an SMT. In some examples, the third connector of a memory device can include a gold finger of a DIMM. The second and third connectors of the motherboard and memory device can be on opposite sides of the first connector of the motherboard and memory device. In some examples, a first of the two or more parallel ground pins can be positioned parallel to the first signal pin. In some examples, a second of the two or more parallel ground pins can be positioned parallel to the second signal pin. In some examples, the two or more parallel ground pins can provide a signal to ground ratio of approximately 1:N, where N is greater than 1.

Figure 5B:
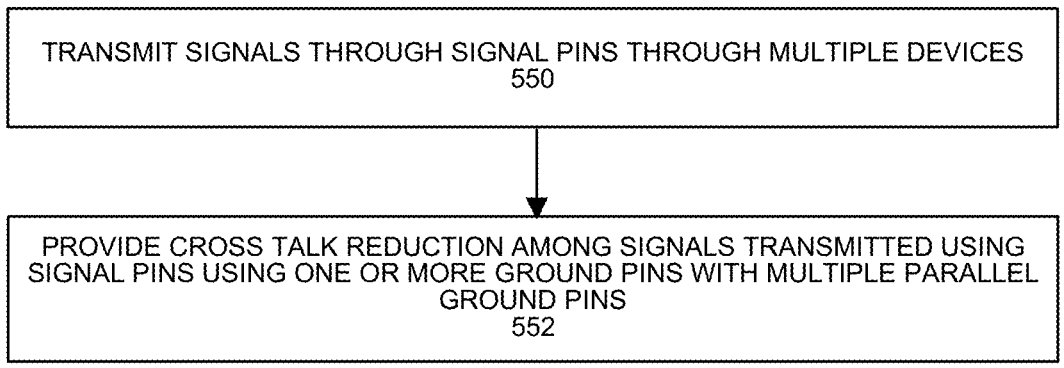

FIG. 5B depicts an example process to utilize a connection between devices with a ground pin and signal pins. At 550, signals can be transmitted in one or more signal pins coupled between multiple devices. One of the devices can include a DIMM and another of the devices can include a motherboard, but any electrical devices that transmit and receive signals can be used.

At 552, a ground pin with multiple ground pin fingers running parallel to signal pins can provide protection or reduction of cross talk between signals transmitted using signal pins separated by the ground pin fingers.

Figure 6:
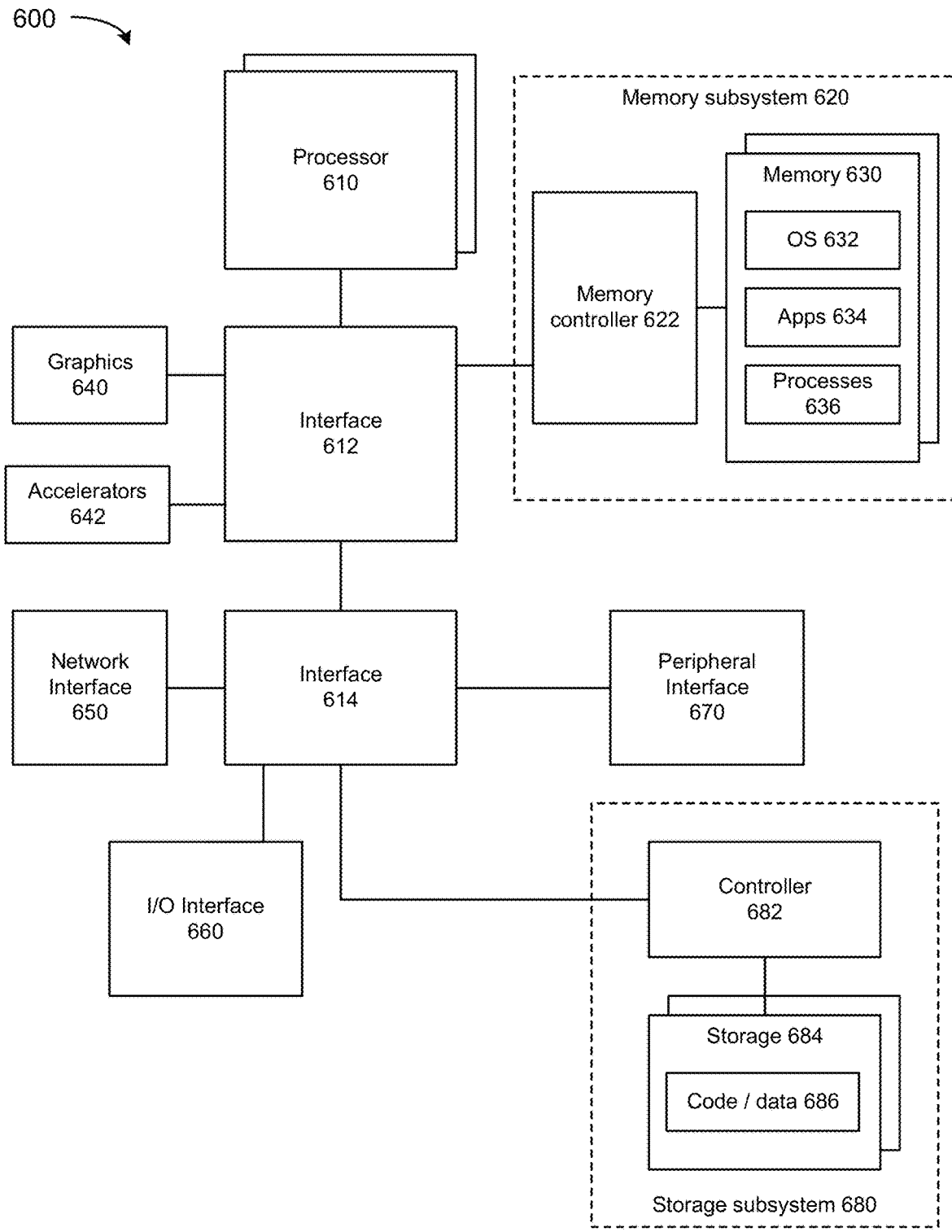
FIG. 6 depicts a system.

FIG. 6 depicts a system. The system can use embodiments described herein to provide ground pin connections to connect devices and provide a signal to ground ratio of 1:N, where N is 1 or more. System 600 includes processor 610, which provides processing, operation management, and execution of instructions for system 600. Processor 610 can include any type of microprocessor, central processing unit (CPU), graphics processing unit (GPU), portfolio of devices (e.g., CPU, GPU, field programmable gate array (FPGA)) (XPU), processing core, or other processing hardware to provide processing for system 600, or a combination of processors. An XPU can include one or more of: a CPU, a graphics processing unit (GPU), general purpose GPU (GPGPU), and/or other processing units (e.g., accelerators or programmable or fixed function FPGAs). Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a programmable or fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 642 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a device that is in the same data center or rack or a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes cache or static random access memory (SRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In some embodiments, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented using interconnected compute sleds of processors, memories, storages, network interfaces, and other components. High speed interconnects can be used such as PCIe, Ethernet, or optical interconnects (or a combination thereof).

Figure 7:
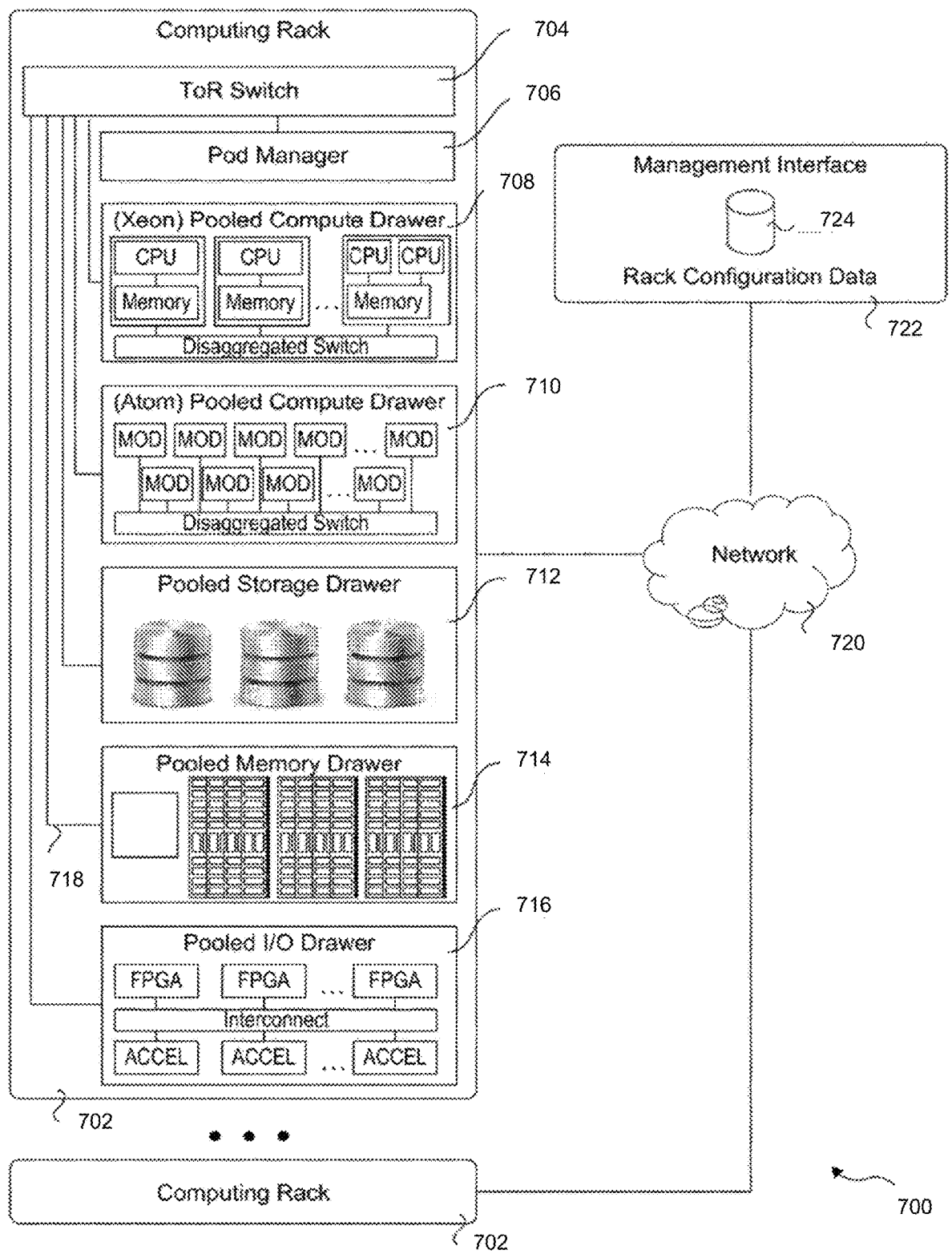
FIG. 7 depicts an example environment.

FIG. 7 depicts an environment 700 includes multiple computing racks 702, each including a Top of Rack (ToR) switch 704, a pod manager 706, and a plurality of pooled system drawers. The environment can use embodiments described herein to provide ground pin connections to connect devices and provide a signal to ground ratio of 1:N, where N is 1 or more. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 708, and Intel® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as an Ethernet link and/or Silicon Photonics (SiPh) optical link.

Multiple of the computing racks 702 may be interconnected via their ToR switches 704 (e.g., to a pod-level switch or data center switch), as illustrated by connections to a network 720. In some embodiments, groups of computing racks 702 are managed as separate pods via pod manager(s) 706. In some embodiments, a single pod manager is used to manage all of the racks in the pod. Alternatively, distributed pod managers may be used for pod management operations.

Environment 700 further includes a management interface 722 that is used to manage various aspects of the environment. This includes managing rack configuration, with corresponding parameters stored as rack configuration data 724. Environment 700 can be used for computing racks.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASICs), programmable logic devices (PLDs), digital signal processors (DSPs), field programmable gate arrays (FPGAs), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes an apparatus comprising: a first signal pin; a second signal pin; and multiple parallel ground pins positioned between the first and second signal pins, the multiple parallel ground pins coupled to a single pin connector coupled to a first device and a single pin connector coupled to a second device, wherein a first leg of the multiple parallel ground pins is positioned parallel to a portion of the first signal pin and wherein a second leg of the multiple parallel ground pins is positioned parallel to a portion of the second signal pin.

Example 2 includes one or more examples, wherein the single pin coupled to a first device comprises a surface mount technology (SMT) connector of a motherboard.

Example 3 includes one or more examples, wherein the single pin connector coupled to a second device comprises a gold finger connector in a dual in-line memory module (DIMM).

Example 4 includes one or more examples, wherein the multiple parallel ground pins provide a 1:N signal to ground ratio for signals transmitted through at least a portion of the first and second signal pins, where N is greater than 1.

Example 5 includes one or more examples, wherein the multiple parallel ground pins comprise two or more ground pins oriented parallel to each other.

Example 6 includes one or more examples, wherein the multiple parallel ground pins comprise one or more of: copper, bronze, or an alloy.

Example 7 includes one or more examples, wherein: the first signal pin is coupled to a first pin connector coupled to the first device and a first pin connector coupled to the second device and the second signal pin is coupled to a second pin connector coupled to the first device and a second pin connector coupled to the second device.

Example 8 includes one or more examples, wherein an arrangement of pin connectors is consistent with Double Data Rate version 5 (DDR5).

Example 9 includes one or more examples, and includes the first device and the second device, wherein the first device comprises a motherboard and the second device comprises a dual in-line memory module (DIMM) and comprising one or more of: central processing unit (CPU), XPU, graphics processing unit (GPU) coupled to the motherboard and to receive data using the first signal pin and the second signal pin.

Example 10 includes one or more examples, and includes a method that includes: transmitting a first signal through a first signal pin from a first device to a second device; transmitting second signal through a second signal pin from the first device to the second device; and providing reduction of near end cross talk and far end cross talk between the first and second signals using a ground pin with multiple parallel ground pins connected to a single pin with the first device and connected to a second single pin with the second device.

Example 11 includes one or more examples, wherein the first signal pin is coupled to a surface mount technology (SMT) connector of a motherboard and a gold finger connector in a dual in-line memory module (DIMM) and the second signal pin is coupled to a second SMT connector of a motherboard and a second gold finger connector in a DIMM.

Example 12 includes one or more examples, wherein an arrangement of SMT connectors and gold finger connectors is consistent with Double Data Rate version 5 (DDR5).

Example 13 includes one or more examples, wherein the multiple parallel ground pins provide a 1:N signal to ground ratio for signals transmitted through at least a portion of the first and second signal pins, where N is greater than 1.

Example 14 includes one or more examples, wherein the multiple parallel ground pins comprise two or more ground pins oriented parallel to each other.

Example 15 includes one or more examples, wherein the multiple parallel ground pins comprise one or more of: copper, bronze, or an alloy.

Example 16 includes one or more examples, wherein the first device comprises a motherboard and the second device comprises a dual in-line memory module (DIMM) and comprising one or more of: central processing unit (CPU), XPU, graphics processing unit (GPU) coupled to the motherboard and to receive data using the first signal pin and the second signal pin.

Example 17 includes one or more examples, and includes a system comprising: a first device comprising a motherboard; a second device comprising a dual in-line memory module (DIMM); a first signal pin; a second signal pin; and multiple parallel ground pins positioned between the first and second signal pins, the multiple parallel ground pins coupled to a single pin connector coupled to the first device and a single pin connector coupled to the second device, wherein a first leg of the multiple parallel ground pins is positioned parallel to a portion of the first signal pin and wherein a second leg of the multiple parallel ground pins is positioned parallel to a portion of the second signal pin.

Example 18 includes one or more examples, wherein an arrangement of pin connectors is consistent with Double Data Rate version 5 (DDR5).

Example 19 includes one or more examples, wherein the multiple parallel ground pins comprise two or more ground pins oriented parallel to each other.

Example 20 includes one or more examples, wherein the multiple parallel ground pins provide a 1:N signal to ground ratio for signals transmitted through at least a portion of the first and second signal pins, where N is greater than 1.

What is claimed is:
1. An apparatus comprising:
a first signal pin;
a second signal pin; and
multiple parallel ground pins positioned between the first and second signal pins, the multiple parallel ground pins coupled to a first single pin contact region coupled to a first device and a second single pin contact region coupled to a second device, wherein
the first device comprises a motherboard,
the first single pin contact region is coupled to a surface mount technology (SMT) connector of the motherboard,
the second device comprises a dual in-line memory module (DIMM),
the first device is oriented perpendicular to the second device,
the second single pin contact region is coupled to a gold finger connector in the DIMM,
a first leg of the multiple parallel ground pins is positioned parallel to a portion of the first signal pin,
a second leg of the multiple parallel ground pins is positioned parallel to a portion of the second signal pin, the first leg and the second leg join to form the first single pin contact region at a first end, the first leg and the second leg join to form the second single pin contact region at a second end, the first and second signal pins are positioned parallel and are coupled to respective SMT connectors in the first device and respective gold finger connectors in the second device, and the multiple parallel ground pins provide a 1:N signal to ground ratio for signals transmitted through at least a portion of the first and second signal pins, where N is greater than 1.

2. The apparatus of claim 1, wherein the multiple parallel ground pins comprise two or more ground pins oriented parallel to each other.

3. The apparatus of claim 1, wherein the multiple parallel ground pins comprise one or more of: copper, bronze, or an alloy.

4. The apparatus of claim 1, wherein an arrangement of contact regions is consistent with Double Data Rate version 5 (DDR5).

5. The apparatus of claim 1, further comprising the first device and the second device, and one or more of: central processing unit (CPU), XPU, graphics processing unit (GPU) coupled to the motherboard and to receive data using the first single pin contact region and the second single pin contact region.

6. A method comprising:

transmitting a first signal through a first signal pin from a first device to a second device;

transmitting a second signal through a second signal pin from the first device to the second device; and providing reduction of near end cross talk and far end cross talk between the first and second signals using a ground pin with multiple parallel ground pins connected to a single pin contact region with the first device and connected to a second single pin contact region with the second device, wherein:

the first single pin contact region is coupled to a surface mount technology (SMT) connector of the first device, the first device is oriented perpendicular to the second device, the second single pin contact region is coupled to a gold finger connector in the second device, a first leg of the multiple parallel ground pins is positioned parallel to a portion of the first signal pin, a second leg of the multiple parallel ground pins is positioned parallel to a portion of the second signal pin, the first leg and the second leg join to form the first single pin contact region at a first end, the first leg and the second leg join to form the second single pin contact region at a second end, and the first and second signal pins are positioned parallel and are coupled to respective SMT connectors in the first device and respective gold finger connectors in the second device.

7. The method of claim 6, wherein an arrangement of the SMT connectors and gold finger connectors is consistent with Double Data Rate version 5 (DDR5).

8. The method of claim 6, wherein the multiple parallel ground pins provide a 1:N signal to ground ratio for signals transmitted through at least a portion of the first and second signal pins, where N is greater than 1.

9. The method of claim 6, wherein the multiple parallel ground pins comprise two or more ground pins oriented parallel to each other.

10. The method of claim 6, wherein the multiple parallel ground pins comprise one or more of: copper, bronze, or an alloy.

11. The method of claim 6, wherein the first device comprises a motherboard and the second device comprises a dual in-line memory module (DIMM) and comprising one or more of: central processing unit (CPU), XPU, graphics processing unit (GPU) coupled to the motherboard and to receive data using the first signal pin and the second signal pin.

12. A system comprising:

a first device comprising a motherboard;

a second device comprising a dual in-line memory module (DIMM);

a first signal pin;

a second signal pin; and multiple parallel ground pins positioned between the first and second signal pins, the multiple parallel ground pins coupled to a first single pin contact region coupled to the first device and a second single pin contact region coupled to the second device, wherein:

the first device comprises a motherboard, the first single pin contact region is coupled to a surface mount technology (SMT) connector of the motherboard, the second device comprises a dual in-line memory module (DIMM), the first device is oriented perpendicular to the second device, the second single pin contact region is coupled to a gold finger connector in the DIMM, a first leg of the multiple parallel ground pins is positioned parallel to a portion of the first signal pin, a second leg of the multiple parallel ground pins is positioned parallel to a portion of the second signal pin, the first leg and the second leg join to form the first single pin contact region at a first end, the first leg and the second leg join to form the second single pin contact region at a second end, and the first and second signal pins are positioned parallel and are coupled to respective SMT connectors in the first device and respective gold finger connectors in the second device.

13. The system of claim 12, wherein an arrangement of contact regions pin connectors is consistent with Double Data Rate version 5 (DDR5).

14. The system of claim 12, wherein the multiple parallel ground pins comprise two or more ground pins oriented parallel to each other.

15. The system of claim 12, wherein the multiple parallel ground pins provide a 1:N signal to ground ratio for signals transmitted through at least a portion of the first and second signal pins, where N is greater than 1.

* * * * *